United States Patent
Yang et al.

(10) Patent No.: US 7,741,217 B2
(45) Date of Patent: Jun. 22, 2010

(54) DUAL WORKFUNCTION SILICIDE DIODE

(75) Inventors: Haining S. Yang, Wappingers Falls, NY (US); Xiangdong Chen, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 419 days.

(21) Appl. No.: 11/924,045

(22) Filed: Oct. 25, 2007

(65) Prior Publication Data
US 2009/0108364 A1    Apr. 30, 2009

(51) Int. Cl.
*H01L 21/8238* (2006.01)

(52) U.S. Cl. ............... 438/655; 438/527; 257/E21.636; 257/E21.637

(58) Field of Classification Search .......... 438/527, 438/655; 257/E21.636, E21.637
See application file for complete search history.

(56) References Cited

U.S. PATENT DOCUMENTS

| | | | |
|---|---|---|---|
| 6,506,676 B2 | 1/2003 | Park et al. | |
| 6,642,132 B2 | 11/2003 | Cho et al. | |
| 6,768,179 B2 | 7/2004 | Cho et al. | |
| 6,909,137 B2 | 6/2005 | Divakaruni et al. | |
| 7,157,359 B2 | 1/2007 | Park et al. | |
| 2002/0086504 A1 | 7/2002 | Park et al. | |
| 2002/0123189 A1 | 9/2002 | Cha et al. | |
| 2004/0262651 A1* | 12/2004 | Mouli | 257/290 |
| 2006/0163631 A1 | 7/2006 | Chen et al. | |
| 2006/0228848 A1 | 10/2006 | Chan et al. | |
| 2006/0244075 A1 | 11/2006 | Chen et al. | |
| 2007/0020865 A1 | 1/2007 | Chen et al. | |
| 2007/0040225 A1 | 2/2007 | Yang | |
| 2007/0051996 A1 | 3/2007 | Chen et al. | |
| 2008/0128767 A1* | 6/2008 | Adkisson et al. | 257/292 |

* cited by examiner

*Primary Examiner*—David Vu
*Assistant Examiner*—Earl N Taylor
(74) *Attorney, Agent, or Firm*—Joseph P. Abate; Howard M. Cohn

(57) ABSTRACT

A CMOS diode and method of making it are disclosed. In one embodiment, the diode comprises a silicon substrate having an N doped region and a P doped region. A first silicide region is formed on the N doped region of the silicon substrate, and a second silicide region formed on the P doped region of the silicon substrate. The first silicide region is comprised of a material having a bandgap value lower than the bandgap value of the material comprising the second silicide region. The result is a diode where the workfunction of each region of silicide more closely matches the workfunction of the doped silicon it contacts, resulting in reduced contact resistance. This provides for a diode with improved performance characteristics.

1 Claim, 12 Drawing Sheets

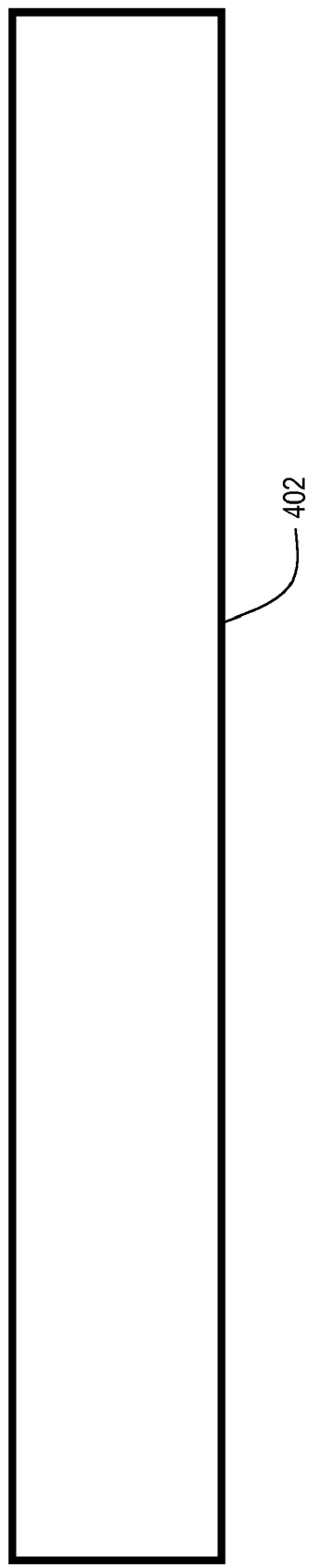

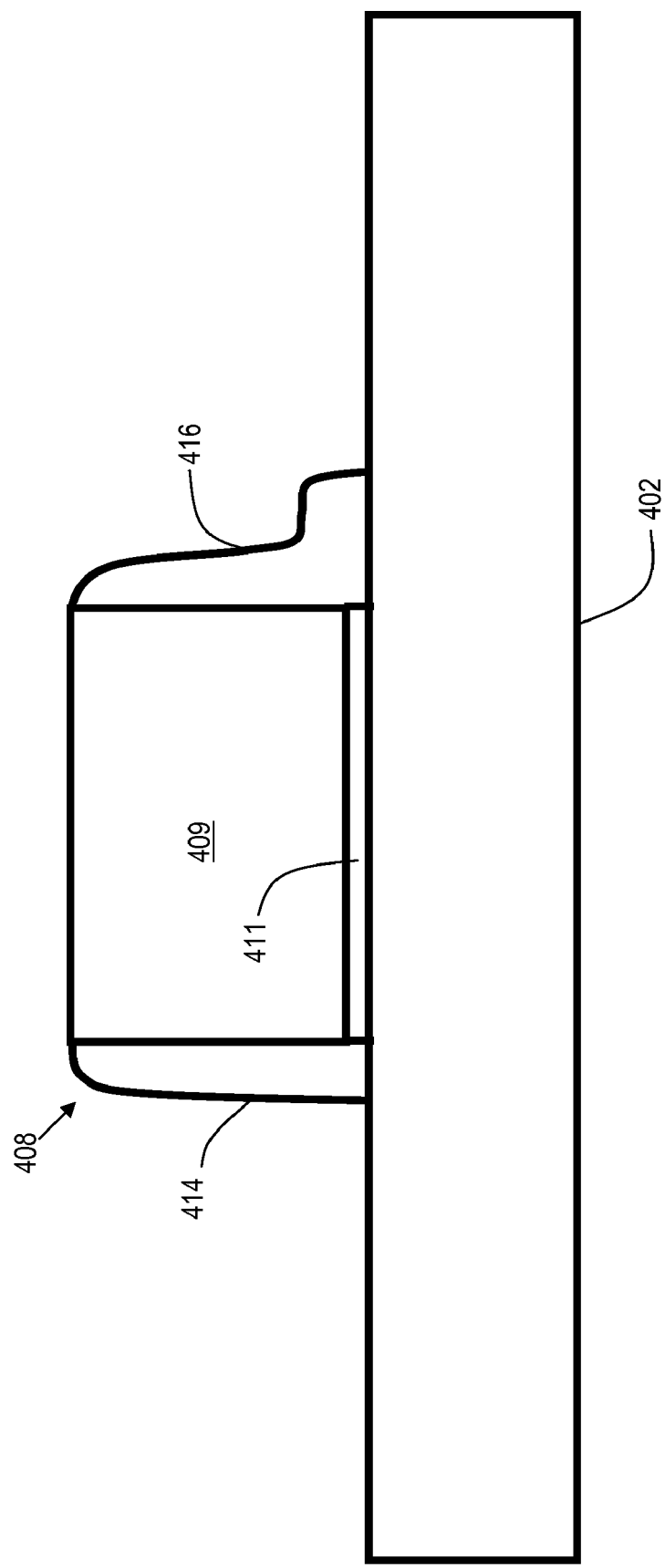

DUAL WORKFUNCTION SILICIDE DIODE

RELATED APPLICATIONS

This application relates to U.S. patent application Ser. No. 11/924,059, "SRAM CELL HAVING A RECTANGULAR COMBINED ACTIVE AREA FOR PLANAR PASS GATE AND PLANAR PULL-DOWN NFETS", to Xiangdong Chen et al., filed Oct. 25, 2007 and having a common assignee with the present invention.

This application relates to U.S. patent application Ser. No. 11/924,053, "INTEGRATION SCHEME FOR MULTIPLE METAL GATE WORK FUNCTION STRUCTURES", to Kangguo Cheng et al., filed Oct. 25, 2007 and having a common assignee with the present invention.

FIELD OF THE INVENTION

The invention generally relates to a diode structure, and, more particularly, to a CMOS diode structure and method of forming the structure.

BACKGROUND

CMOS diodes are important passive components in modern integrated circuit (IC) devices. The diode is also used in bandgap reference circuits, requiring a tight range of specification of the device parameters.

In FIG. 1, a prior art CMOS diode 100 is shown. CMOS diode 100 is comprised of a silicon substrate 102. Region 104 of the substrate is doped with an N+ species to form an N doped region (also referred to as an N+ region), and region 107 is doped with a P+ species to form a P doped region (also referred to as a P+ region). Region 106 remains as the original N type silicon substrate. A polysilicon gate structure 108 is disposed above region 106, and in between regions 104 and 106. The polysilicon gate structure 108 is comprised of a N+ region 110, and a P+ region 112. Spacer structures 114 and 116 are adjacent to the respective doped regions. As is known in the art, spacer 116, which is adjacent to P+ region 112 may be of a different shape than spacer 114, which is adjacent to N+ region 110. Silicide regions 118, 120, and 122 are all comprised of a similar material, and disposed on the silicon substrate to form contacts. Silicide region 118 forms the anode contact of diode 100, and silicide region 122 forms the cathode contact of the diode 100. Silicide region 120 is formed over the gate structure 118. Electrical connections 126A and 126B connect the gate contact 120 to the anode contact 118 to ground point 126C, thereby rendering the gate contact 120 as "unused." Note that references 126A, 126B, and 126C are schematically indicated, and are not representative of a physical structure in the device. Nitride layer 124 is deposited on the silicon substrate 102, silicide regions 118, 120, and 122, and gate structure 108.

It should clearly be understood that FIG. 1 illustrates but an extremely small (microscopic) portion of an integrated circuit (IC) device, let alone a semiconductor wafer comprising a large plurality of such devices. For example, what is shown may have a width of only a few microns of a semiconductor wafer having a diameter of several inches. Also, in "real life" things are not so neat and clean, rectilinear and uniform as shown. However, for one of ordinary skill in the art to which the invention most nearly pertains, this and other figures presented in this patent application will be very useful, when taken in context of the associated descriptive text, for understanding the invention.

As device dimensions continue to shrink, contact resistance between region 118 and 104, and between region 122 and 108 increases to the point where it starts to dominate the total resistance of the device, resulting in reduced device current. It also adversely impacts device variations that result from the increase resistance variation. Therefore, what is needed is a new diode structure providing reduced contact resistance while also providing the capability for reduced device size.

SUMMARY OF THE INVENTION

The present invention provides a CMOS diode comprising: a silicon substrate, the silicon substrate comprising an N doped region and a P doped region; a first silicide region formed on the N doped region of the silicon substrate, and a second silicide region formed on the P doped region of the silicon substrate, the first silicide region comprised of a material having a band gap value lower than the band gap value of the material comprising the second silicide region; and a nitride layer deposited on the silicon substrate and silicide regions.

The present invention further provides a CMOS diode wherein the first silicide region is comprised of a material selected from the group consisting essentially of Erbium Silicide and Ytterbium Silicide.

The present invention further provides a CMOS diode wherein the first silicide region is comprised of a material selected from the group consisting essentially of Yttrium Silicide, Holmium Silicide, Terbium Silicide, Gadolinium Silicide, Lutetium Silicide, Dysprosium Silicide, and Scandium Silicide.

The present invention further provides a CMOS diode wherein the second silicide region is comprised of a material selected from the group consisting essentially of Iridium Silicide, Osmium Silicide, and Platinum Silicide.

The present invention further provides a CMOS diode, wherein the material forming the first silicide region has a band gap value in the range of about 0.2 electron volts to about 0.5 electron volts and the material forming the second silicide region has a band gap value in the range of about 0.8 electron volts to about 1 electron volt.

The present invention further provides a CMOS diode, wherein the nitride layer has a thickness in the range of about 30 nanometers to about 80 nanometers.

The present invention further provides a CMOS integrated circuit comprising a plurality of CMOS dual silicide diodes, wherein each CMOS dual silicide diode comprises a silicon substrate, the silicon substrate comprising an N doped region and a P doped region; a first silicide region formed on the N doped region of the silicon substrate, and a second silicide region formed on the P doped region of the silicon substrate, the first silicide region comprised of a material having a bandgap value lower than the bandgap value of the material comprising the second silicide region; and a nitride layer deposited on the silicon substrate and silicide regions.

The present invention further provides a CMOS integrated circuit wherein for each CMOS dual silicide diode, the material forming the first silicide region has a band gap value in the range of about 0.2 electron volts to about 0.5 electron volts and the material forming the second silicide region has a band gap value in the range of about 0.8 electron volts to about 1 electron volt.

The present invention further provides a CMOS integrated circuit wherein for each CMOS dual silicide diode, the first silicide region is comprised of a material selected from the group consisting essentially of Erbium Silicide and Ytterbium Silicide.

The present invention further provides a CMOS integrated circuit wherein for each CMOS dual silicide diode, the first silicide region is comprised of a material selected from the group consisting essentially of Yttrium Silicide, Holmium Silicide, Terbium Silicide, Gadolinium Silicide, Lutetium Silicide, Dysprosium Silicide, and Scandium Silicide.

The present invention further provides a CMOS integrated circuit wherein for each CMOS dual silicide diode, the second silicide region is comprised of a material selected from the group consisting essentially of Iridium Silicide, Osmium Silicide, and Platinum Silicide.

The present invention further provides a CMOS integrated circuit wherein for each CMOS dual silicide diode, the nitride layer has a thickness in the range of about 30 nanometers to about 80 nanometers.

The present invention further provides a method of fabricating a CMOS diode comprising the steps of: forming a gate structure on a silicon substrate; doping the silicon substrate to form a P doped region and an N doped region on the silicon substrate; forming an N-side hardmask; forming a P-type silicide region on the P doped region of the silicon substrate; removing the N-side hardmask; forming a P-side hardmask; forming an N-type silicide region on the N doped region of the silicon substrate; removing the P-side hardmask; and forming a nitride layer over the silicon substrate, gate structure, and silicide.

The present invention further provides a method of fabricating a CMOS diode wherein the step of doping the silicon substrate to form a P doped region and an N doped region on the silicon substrate is performed via ion implantation.

The present invention further provides a method of fabricating a CMOS diode wherein the step of forming an N-side hardmask and the step of forming a P-side hardmask is comprised of forming an N-side hardmask comprised of silicon oxide and forming a P-side hardmask comprised of silicon oxide.

The present invention further provides a method of fabricating a CMOS diode wherein the step of forming an N-side hardmask and the step of forming a P-side hardmask is comprised of forming an N-side hardmask comprised of silicon nitride and forming a P-side hardmask comprised of silicon nitride.

The present invention further provides a method of fabricating a CMOS diode wherein the step of forming an N-side hardmask and the step of forming a P-side hardmask is comprised of forming an N-side hardmask with a thickness in the range of about 20 nanometers to about 80 nanometers and forming a P-side hardmask with a thickness in the range of about 20 nanometers to about 80 nanometers.

The present invention further provides a method of fabricating a CMOS diode wherein the step of forming an N-type silicide region comprises the steps of: sputtering a metal selected from the group consisting essentially of Erbium, Ytterbium, Yttrium, Holmium, Terbium, Gadolinium, Lutetium, Dysprosium, and Scandium; and annealing the metal at a temperature in the range of about 200 degrees Celsius to about 550 degrees Celsius.

The present invention further provides a method of fabricating a CMOS diode wherein the step of forming a P-type silicide region comprises the steps of: sputtering a metal selected from the group consisting essentially of Iridium, Osmium, and Platinum; and annealing the metal at a temperature in the range of about 200 degrees Celsius to about 550 degrees Celsius.

The present invention further provides a method of fabricating a CMOS diode wherein the step of forming a nitride layer comprises depositing a nitride layer using a chemical vapor deposition process.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
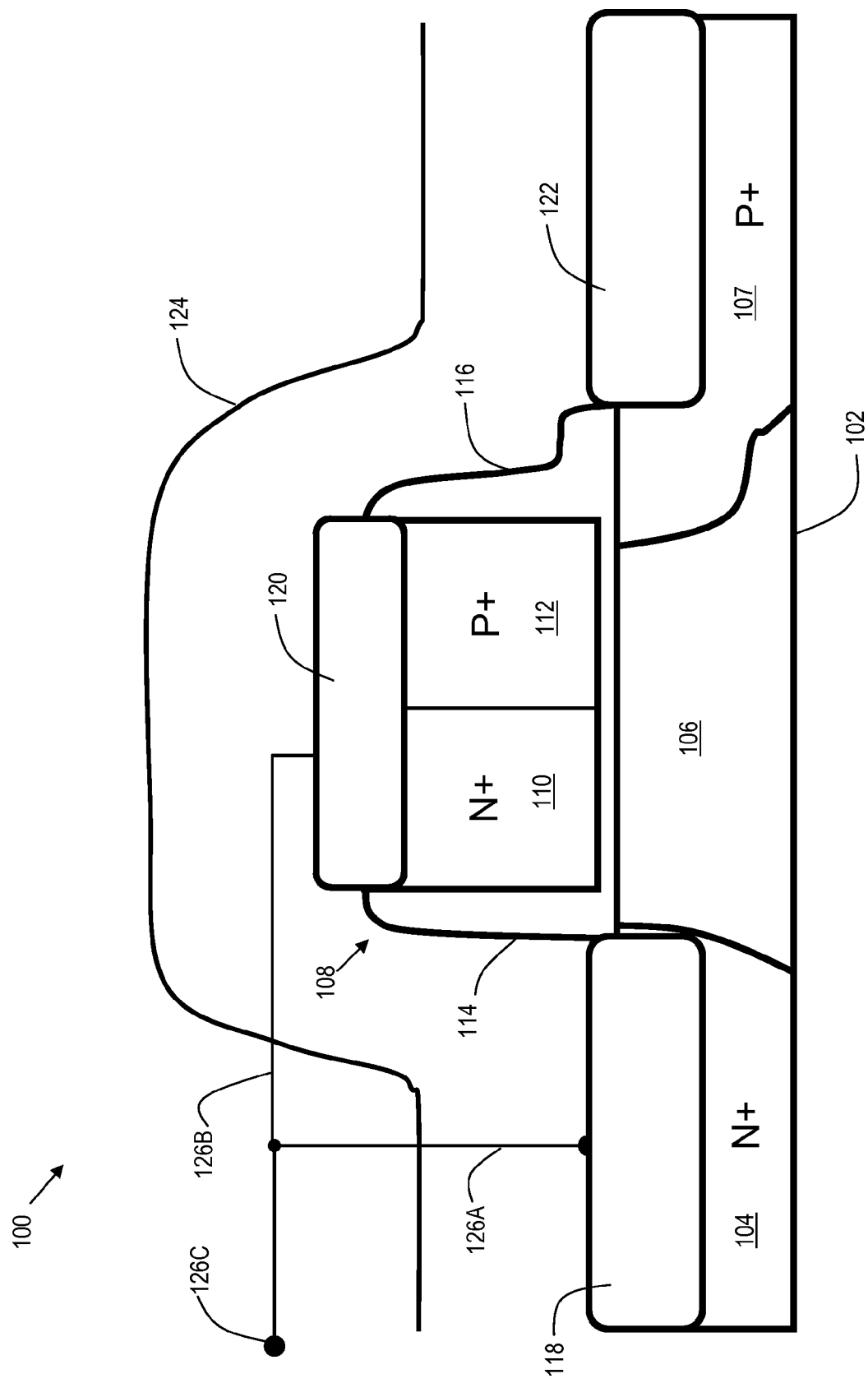

In the drawings accompanying the description that follows, in some cases both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs) of the drawing, in which case typically the last two significant digits may be the same, the most significant digit being the number of the drawing figure (FIG).

FIG. 1 shows the structure of a prior art CMOS diode.

Figure 2:
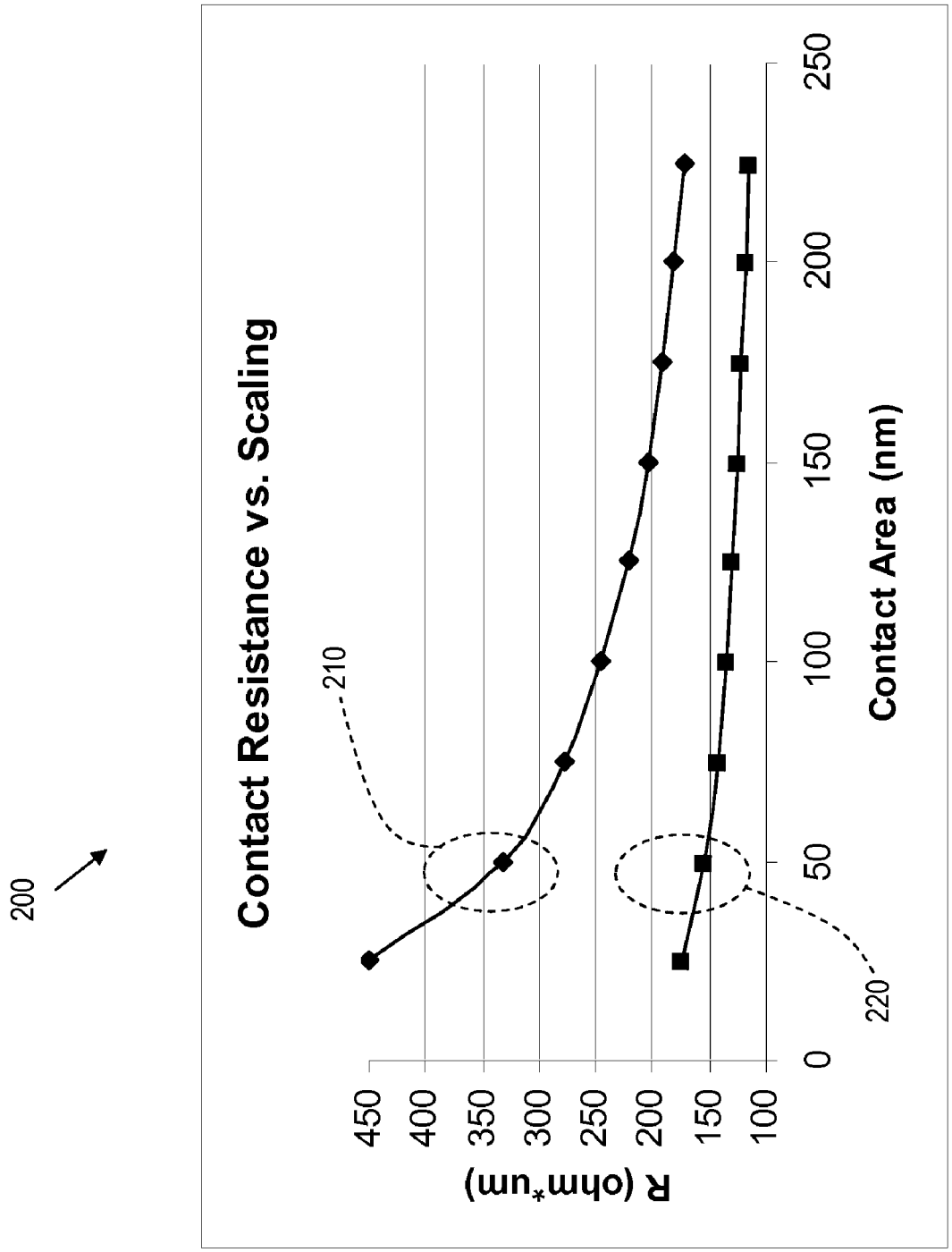

FIG. 2 is a chart showing the relationship of contact resistance versus scaling.

Figure 3:
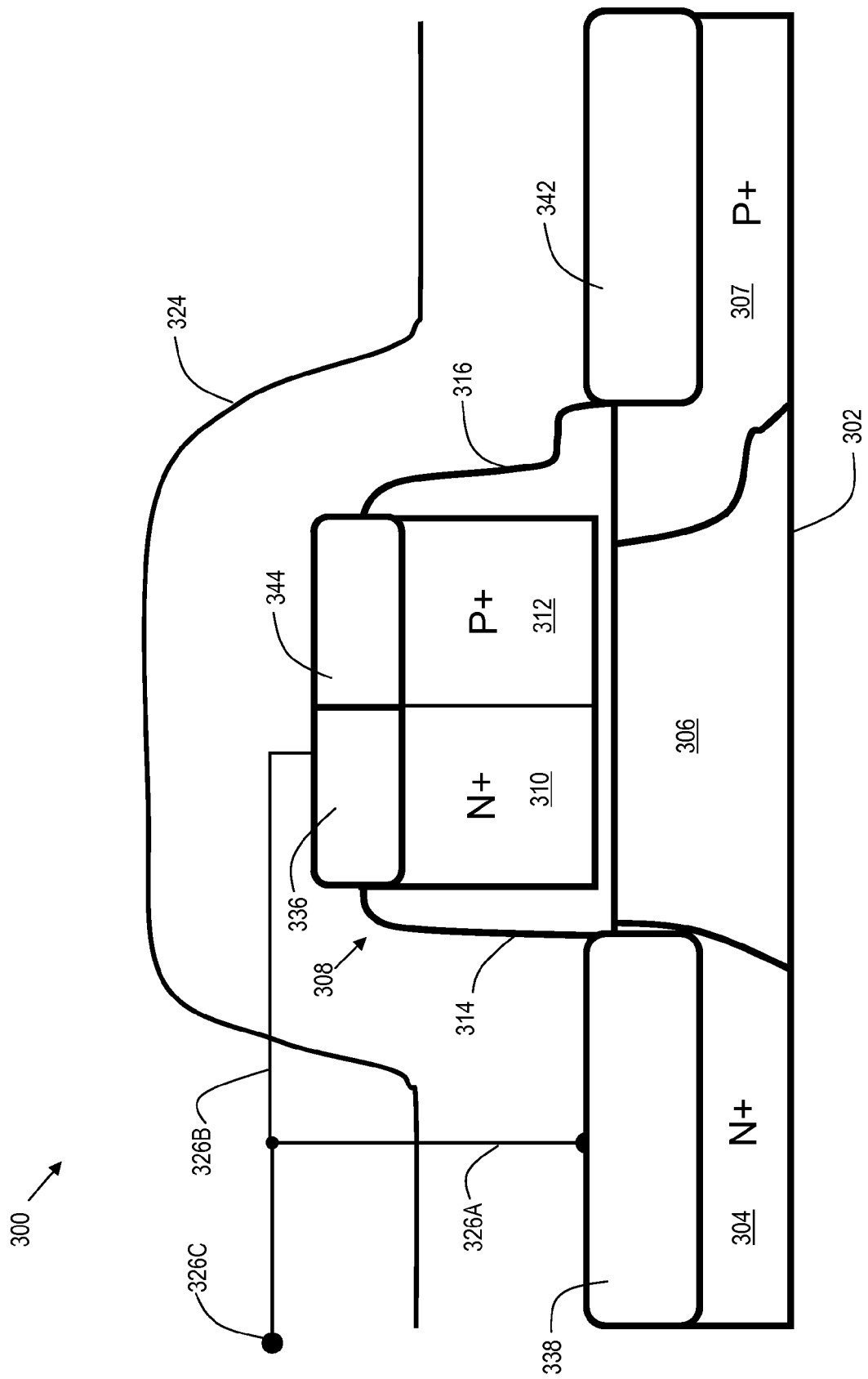

FIG. 3 shows a CMOS diode that embodies principles of the present invention.

FIGS. 4A-4H illustrate the process steps involved in making an embodiment of the present invention.

Figure 5:
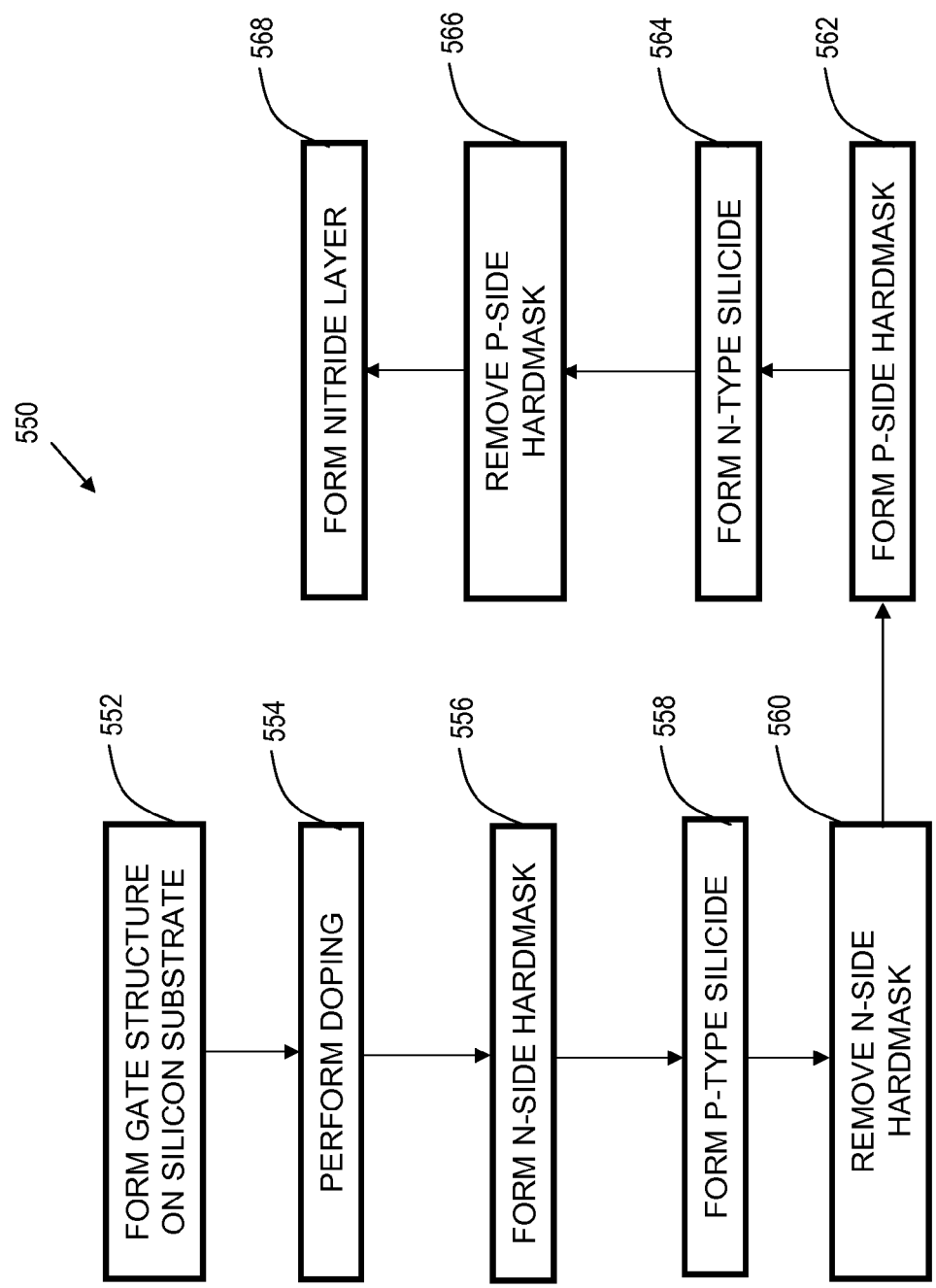

FIG. 5 is a flowchart illustrating the process steps involved in making an embodiment of the present invention.

DETAILED DESCRIPTION

The inventors have made the observation that a mid-gap silicide layer is not optimal for the anode contact or the cathode contact of a diode. This is because the mid-gap silicide has a workfunction (the minimum energy (usually measured in electron volts) needed to remove an electron from a solid to a point immediately outside the solid surface) that is in the approximate "midrange" between the workfunction of the N+ material and the P+ material in the diode. The inventors have found that by using a dual workfunction silicide approach, a diode having improved contact resistance and scaling characteristics is achieved. A dual silicide diode with the aforementioned characteristics increases the performance of a CMOS integrated circuit.

FIG. 2 is a chart 200 showing the relationship of contact resistance versus scaling, and compares a mid-gap silicide material to that of a "matched" silicide material, where the workfunction of the silicide more closely matches the workfunction of the doped silicon material. In particular, region 210 illustrates the contact resistance properties of a mid-gap silicide as is used in the prior art. As the contact area (area where silicide contacts silicon within the diode) is reduced to near 50 nanometers, the contact resistance markedly increases. In contrast, region 220 highlights the contact resistance of when a low band gap silicide, YbSi, is used with N+ silicon. The contact resistance does not increase as rapidly as with the mid-gap silicide as the contact area is reduced. This property results in improved device scalability, since the contact resistance will not dominate the device resistance as the trend of miniaturization of semiconductor devices continues.

FIG. 3 shows a CMOS diode that embodies principles of the present invention. This diode bears some similarities to the diode of FIG. 1, and where applicable, like reference numbers indicate like elements. For example, nitride layer 324 of FIG. 3 is similar to nitride layer 124 of FIG. 1. Whereas the silicide regions 118 and 122 of the prior art device are comprised of similar materials, silicide region 338 is comprised of a different material than silicide region 342. The material of regions 338 and 342 are chosen for their band gap properties. For the material of region 338 that contacts N doped silicon, a low band gap value is desirable. Suitable materials include, but are not limited to Yttrium Silicide, Holmium Silicide, Terbium Silicide, Gadolinium Silicide, Lutetium Silicide, Dysprosium Silicide, Erbium Silicide, Ytterbium Silicide, and Scandium Silicide compounds. In some cases, a silicide may have a variety of forms, such as Ytterbium Silicide, which may be denoted as YbSix, where x can vary. For the material of region 342 that contacts P doped silicon, a high band gap value is desirable. Suitable materials include, but are not limited to, Iridium Silicide, Osmium Silicide, and Platinum Silicide compounds. Region 344 is of similar material to that of region 342, and region 336 is of similar material to that of region 338. As will be explained in more detail in an upcoming section, regions 336 and 344 are formed as a result of the process steps. However, for reasons explained previously in the discussion of FIG. 1, the gate region 308 is not electrically active in the diode device. Using the dual silicide approach shown in FIG. 3 allows an improved diode device to be realized. The contact resistance of the diode 300 is lower than that of diode 100 of FIG. 1, since the band gap of silicide regions 228 and 342 more closely matches that of the silicon region they contact, as compared with the use of the mid gap silicide (regions 118 and 122 of FIG. 1).

Figure 4C:
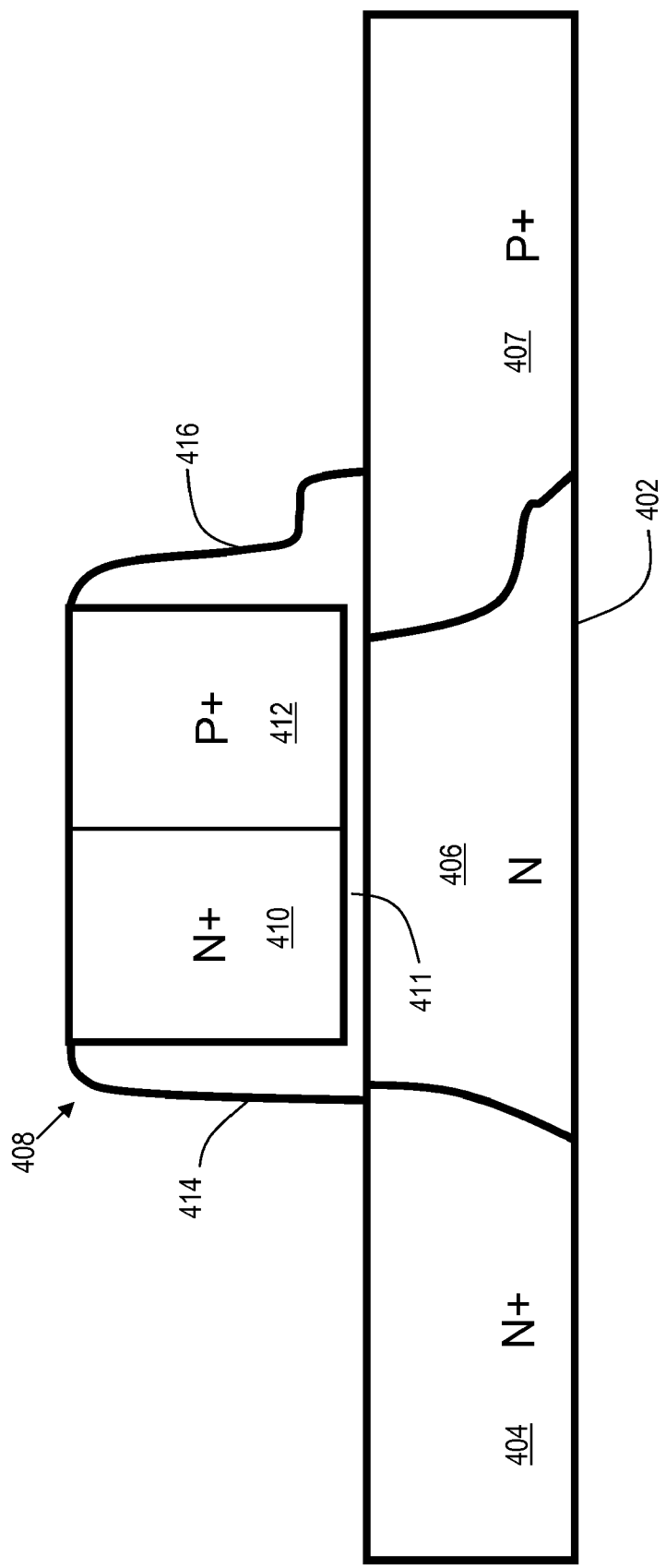

FIGS. 4A-4H illustrate the process steps involved in a method of making an embodiment of the present invention. FIG. 4A shows the first step of the process of making an embodiment of the present invention, which starts with a substrate of N-type silicon.

FIG. 4B shows the step of the formation of gate structure 408. A gate oxide 411 is disposed on substrate 402. Polysilicon 409 is disposed on top of the gate oxide 411. Spacers 414 and 416 are adjacent to polysilicon 409.

FIG. 4C shows the step of doping the silicon with the appropriate species using industry standard lithography techniques. This creates three regions on substrate 402: N+ region 404, N region (non-implanted) 406, and P+ region 407. As illustrated in FIG. 4C, the left half of the structure is generally referred to as the "N side" and the right half is generally referred to as the "P side." The process also results in the formation of doped regions 410 and 412 on in the polysilicon (409 of FIG. 4B) of gate structure 408. In a preferred embodiment, the doping is performed via ion implantation.

Figure 4D:
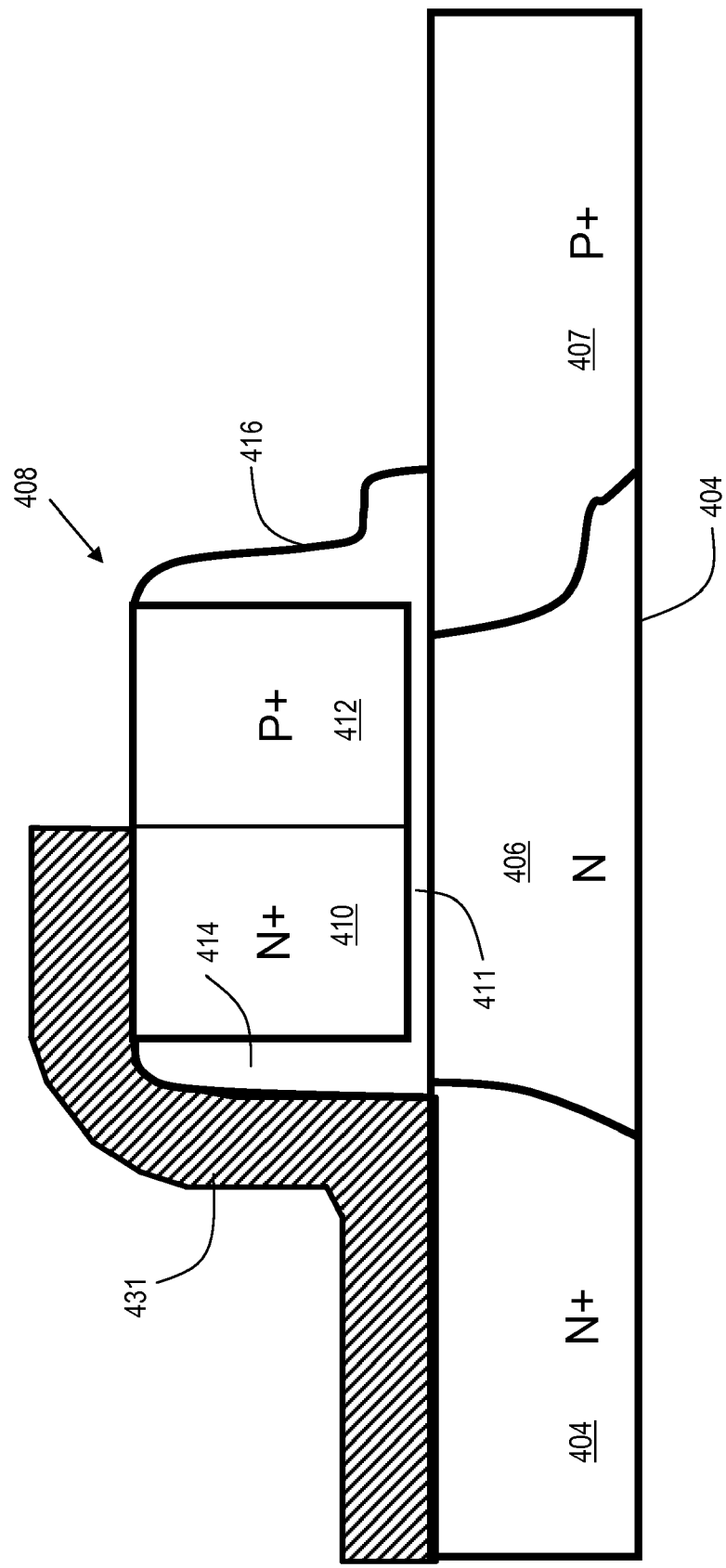

FIG. 4D shows the step of covering the N side of the diode structure with a hardmask 431. The hardmask is preferably comprised of silicon oxide (SiO2) or silicon nitride (Si3N4), and is typically in the range of about 20 nanometers to about 80 nanometers. A hardmask of this thickness serves to protect the N side during the P-side silicide formation which is shown in the next step. The hard mask is preferably deposited via a Chemical Vapor Deposition (CVD) process.

Figure 4E:
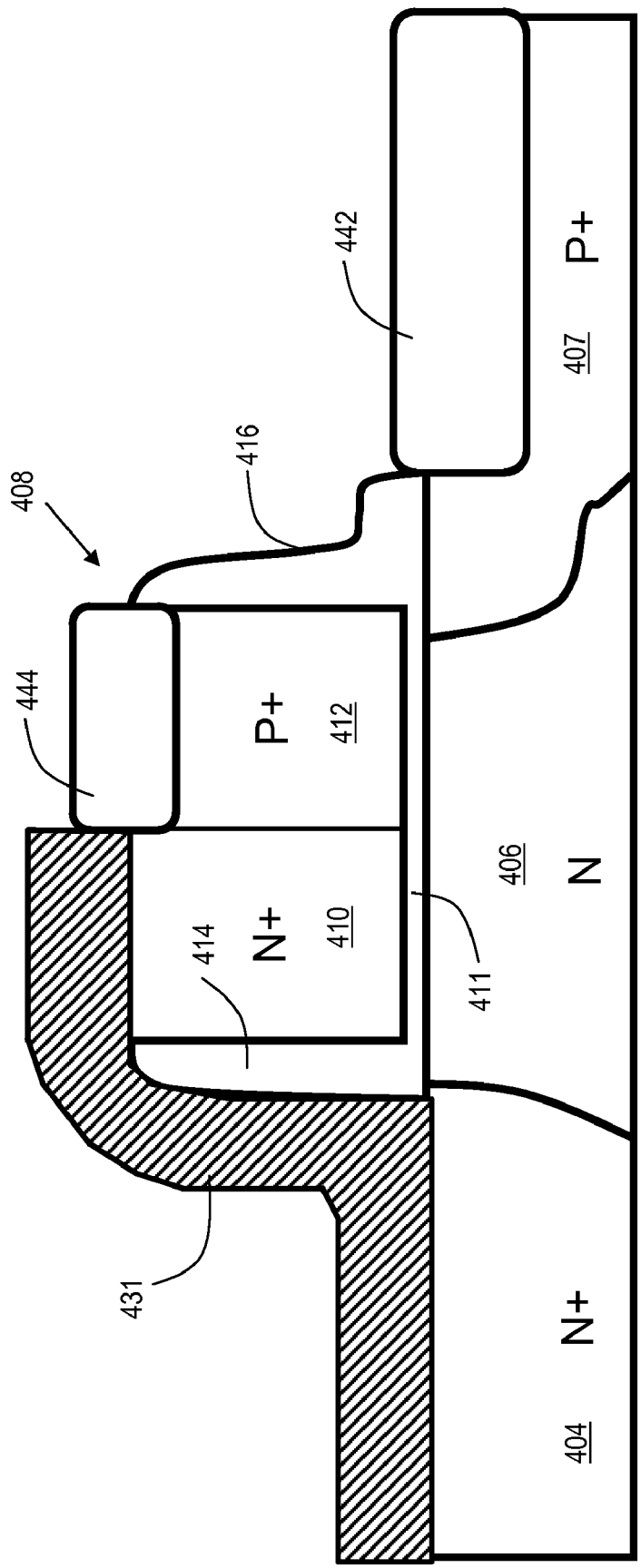

FIG. 4E shows the step of forming P-type silicide regions 442 and 444 on the exposed silicon surface. In one embodiment, the material for silicide regions 442 and 444 is comprised of a PtSi compound or an IrSi compound. The silicide regions are formed using industry standard techniques such as a sputter process to deposit the metal, followed by an anneal process to cause a reaction between the metal and the silicon to form the silicide. The anneal process preferably occurs at a temperature in the range of between about 250 to about 600 degrees Celsius.

Figure 4F:
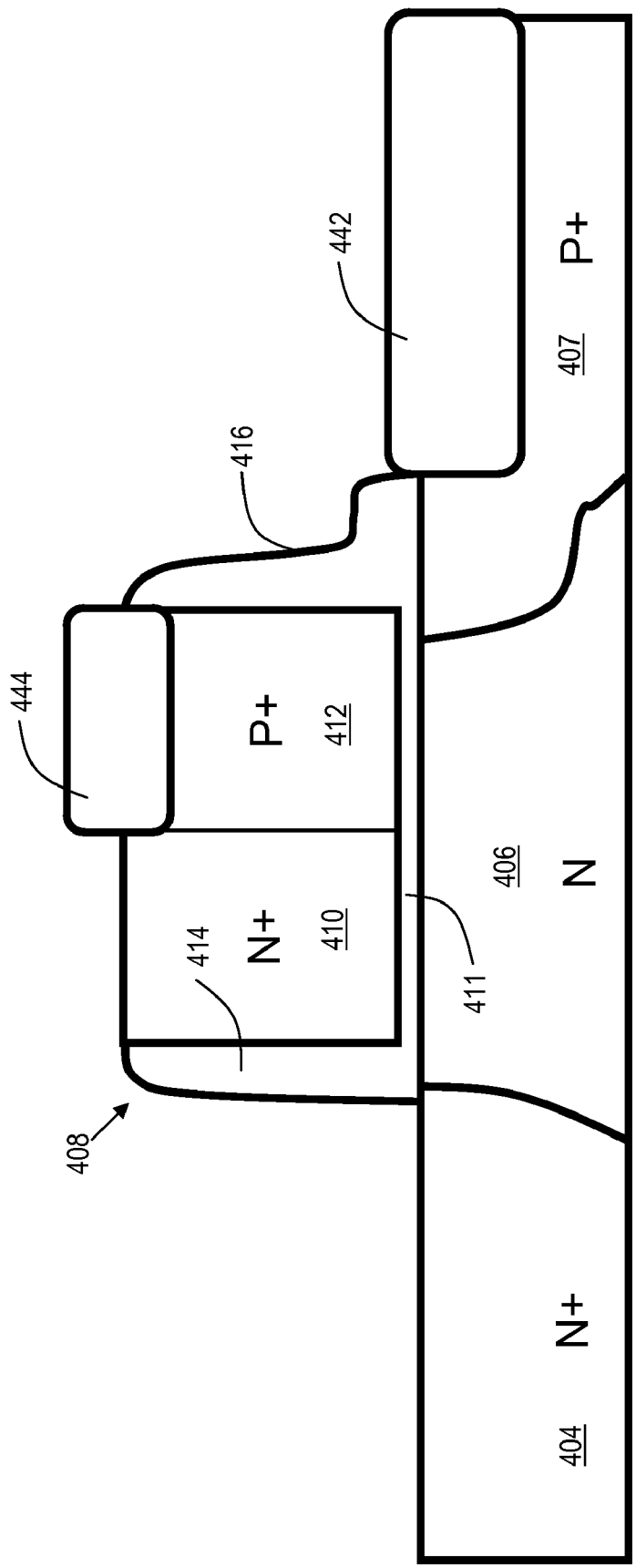

FIG. 4F shows the structure after the removal of the hardmask (431 of FIG. 4D). The hardmask is preferably removed via an etch process. A dry or wet etch process may be used.

Figure 4G:
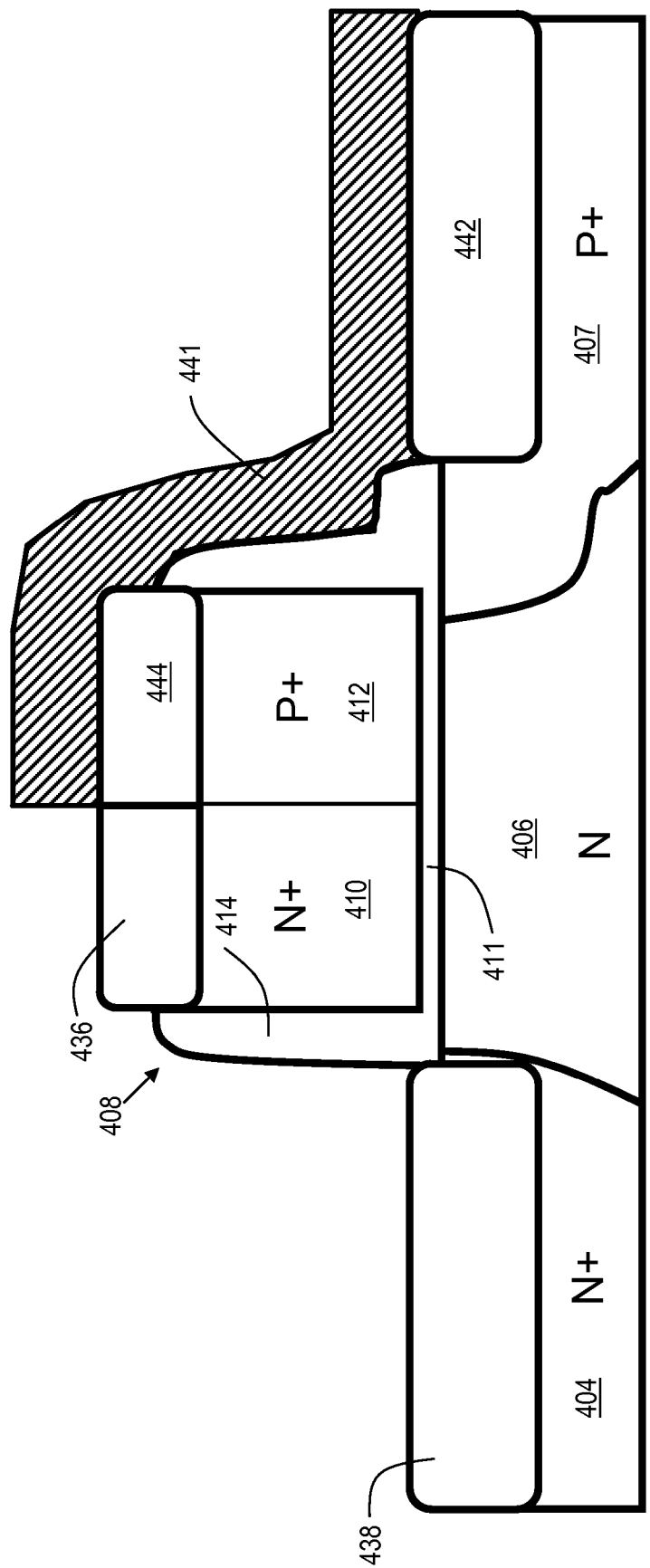

FIG. 4G shows the steps of covering the P side of the diode structure with a hardmask 441, and the formation of N-type silicide regions 436 and 438. This is similar in concept to the steps shown in FIG. 4D and FIG. 4E. However, in this case, the material used for silicide regions 436 and 438 is different than that of silicide regions 442 and 444. In one embodiment, the material used for silicide regions 436 and 438 is comprised of a YbSi compound. A sputtering process deposits a metal such as Erbium, Ytterbium, Yttrium, Holmium, Terbium, Gadolinium, Lutetium, Dysprosium, or Scandium. This step is followed by an anneal process at a temperature range of about 200 degrees Celsius to about 550 degrees Celsius. The anneal process is used to form the N-type silicide, similar to what was described for the formation of the P-type silicide (see FIG. 4E).

Figure 4H:
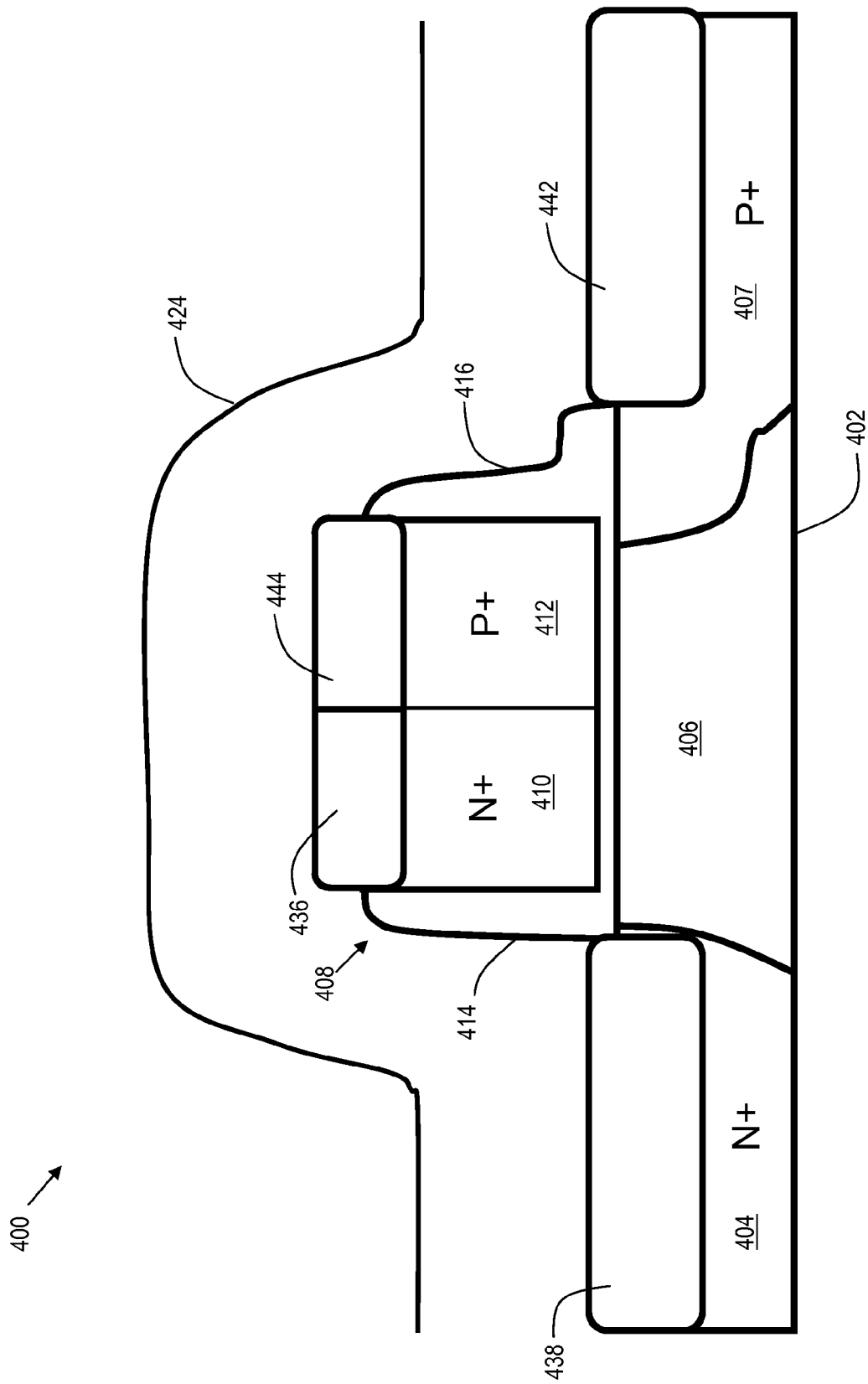

FIG. 4H shows a completed diode 400 after the removal of hardmask 441, and the deposition of a nitride layer 424. In one embodiment, the nitride layer is comprised of $Si_3N_4$. Nitride layer 424 preferably has a thickness in the range of about 30 nanometers to about 80 nanometers, and may be applied via a Chemical Vapor Deposition process, or other suitable technique.

FIG. 5 is a flowchart 500 illustrating the process steps involved in making an embodiment of the present invention. In process step 552, a gate structure is formed on the silicon substrate. In process step 554 doping (e.g. via ion implantation) is performed to provide the N+ and P+ regions of the silicon substrate. In process step 556, the N-Side hardmask is formed (see FIG. 4E). In process step 558, the P-type silicide is formed. This may be accomplished via a sputtering process followed by an anneal process. In process step 560, the N-side hardmask is removed. This is typically performed via an etch technique. The result of process step 560 is illustrated in FIG. 4F. In process step 562, a P-side hardmask is formed. In process step 564, the N-type silicide is formed in a similar manner to the P-type silicide that was formed in process step 558 (see FIG. 4G). In process step 566 the P-side hardmask is removed. Finally, in step 568, a nitride layer (424 of FIG. 4H) is formed over the diode.

It will be understood that the present invention may have various other embodiments. Furthermore, while the form of the invention herein shown and described constitutes a preferred embodiment of the invention, it is not intended to illustrate all possible forms thereof. It will also be understood that the words used are words of description rather than limitation, and that various changes may be made without departing from the spirit and scope of the invention disclosed. Thus, the scope of the invention should be determined by the appended claims and their legal equivalents, rather than solely by the examples given.

What is claimed is:

1. A method of fabricating a CMOS diode comprising the steps of:

forming a gate structure on a silicon substrate;

doping the silicon substrate to form a P doped region and an N doped region on the silicon substrate, wherein the step of doping the silicon substrate to form the P doped region and the N doped region on the silicon substrate is performed via ion implantation;

forming an N-side hardmask, wherein the N-side hardmask is comprised of silicon oxide with a thickness in the range of about 20 nanometers to about 80 nanometers;

forming a P-type silicide region on the P doped region of the silicon substrate;

removing the N-side hardmask;

forming a P-side hardmask, wherein the P-side hardmask is comprised of silicon oxide with a thickness in the range of about 20 nanometers to about 80 nanometers;

forming an N-type silicide region on the N doped region of the silicon substrate;

removing the P-side hardmask; and forming a nitride layer over the silicon substrate, gate structure, and silicide, the step of forming a nitride layer comprises depositing a nitride layer using a chemical vapor deposition process; and wherein the step of forming an N-type silicide region comprises the steps of:

sputtering a metal selected from the group consisting essentially of Erbium, Ytterbium, Yttrium, Holmium, Terbium, Gadolinium, Lutetium, Dysprosium, and Scandium; and annealing the metal at a temperature in the range of about 200 degrees Celsius to about 550 degrees Celsius.

* * * * *